(12) United States Patent
Kim et al.

(10) Patent No.: US 8,981,378 B2
(45) Date of Patent: Mar. 17, 2015

(54) MOTHER SUBSTRATE FOR ORGANIC LIGHT-EMITTING DISPLAY APPARATUS

(71) Applicant: Samsung Display Co., Ltd., Yongin (KR)

(72) Inventors: Kwang-Min Kim, Yongin (KR); Won-Kyu Kwak, Yongin (KR); Jin-Tae Jeong, Yongin (KR); Ji-Hyun Ka, Yongin (KR)

(73) Assignee: Samsung Display Co., Ltd., Yongin (KR)

( * ) Notice: Subject to any disclaimer, the term of this patent is extended or adjusted under 35 U.S.C. 154(b) by 0 days.

(21) Appl. No.: 14/219,763

(22) Filed: Mar. 19, 2014

(65) Prior Publication Data

US 2015/0008432 A1 Jan. 8, 2015

(30) Foreign Application Priority Data

Jul. 5, 2013 (KR) ........................ 10-2013-0079034

(51) Int. Cl.
*H01L 27/14* (2006.01)
*H01L 27/12* (2006.01)
*H01L 21/66* (2006.01)

(52) U.S. Cl.
CPC .............. *H01L 27/124* (2013.01); *H01L 22/32* (2013.01)
USPC .............................................. 257/72; 257/32

(58) Field of Classification Search
CPC ....................................................... H01L 29/04
USPC ......................................... 257/48, 32, 72, 99
See application file for complete search history.

(56) References Cited

U.S. PATENT DOCUMENTS

| 8,367,444 | B2 * | 2/2013 | Kim et al. ........................ 438/34 |
| 8,614,591 | B2 * | 12/2013 | Kim et al. ................ 324/762.07 |
| 2006/0043508 | A1 * | 3/2006 | Ohta et al. ..................... 257/417 |
| 2008/0198284 | A1 * | 8/2008 | Oyamada ........................ 349/39 |
| 2009/0278835 | A1 | 11/2009 | Ka |
| 2010/0052564 | A1 * | 3/2010 | Park et al. ..................... 315/291 |
| 2011/0080173 | A1 | 4/2011 | Kim et al. |
| 2012/0146085 | A1 * | 6/2012 | Park et al. ....................... 257/99 |

FOREIGN PATENT DOCUMENTS

| JP | 09-265110 | 10/1997 |
| KR | 10-2009-0116334 | 11/2009 |
| KR | 10-2011-0037638 | 4/2011 |
| KR | 10-2012-0065521 | 6/2012 |

\* cited by examiner

*Primary Examiner* — Yu-Hsi D Sun
*Assistant Examiner* — Chi-Hua Yang
(74) *Attorney, Agent, or Firm* — H.C. Park & Associates, PLC (57) ABSTRACT

A mother substrate for an organic light-emitting display apparatus. The mother substrate has a panel area and a peripheral area surrounding the panel area, pixels disposed in a display area of the panel area, pads that are disposed in a non-display area of the panel area and are coupled to the pixels, test wirings disposed in the peripheral area, a local buffer electrically connected to the test wirings, a bridge wiring connecting the local buffer to one of the pads, and a dummy resistance layer having one end in contact with the bridge wiring and another end in contact with one of the test wirings.

20 Claims, 6 Drawing Sheets

MOTHER SUBSTRATE FOR ORGANIC LIGHT-EMITTING DISPLAY APPARATUS

CROSS-REFERENCE TO RELATED APPLICATION

This application claims priority from and the benefit of Korean Patent Application No. 10-2013-0079034, filed on Jul. 5, 2013, which is hereby incorporated by reference for all purposes as if fully set forth herein.

BACKGROUND

1. Field

Exemplary embodiments of the present invention relate to a display apparatus, and more particularly, to a mother substrate for an organic light-emitting display apparatus.

2. Discussion of the Background

In general, organic light-emitting display apparatuses are respectively manufactured in various panel areas included in a mother substrate, and the organic light-emitting display apparatuses are individually separated along cutting lines on the edges of the panel areas when the manufacturing of the organic light-emitting display apparatuses are completed. Tests for applying various test signals and power to the organic light-emitting apparatuses are performed in order to examine the presence of defects before the separation of the individual organic light-emitting apparatuses. Various test signals and a power supply are transmitted to the organic light-emitting display apparatus through test wirings disposed in a peripheral area around the panel area in which the organic light-emitting apparatus is disposed. The test wirings are coupled to pads included in the organic light-emitting display apparatus.

However, because some pads are not directly connected through test wirings and wiring lines but are connected through a circuit unit including a thin film transistor, some pads may be substantially isolated. Thus, the pads may be easily corroded as a result of an etchant used during a patterning process of a pixel electrode disposed on the pads.

The above information disclosed in this Background section is only for enhancement of understanding of the background of the invention and, therefore, it may contain information that does not form the prior art that is already known in this country to a person of ordinary skill in the art.

SUMMARY

Exemplary embodiments of the present invention provide a mother substrate for an organic light-emitting display apparatus having a structure that may prevent the corrosion of the pad during the patterning process of the pixel electrode.

Additional features of the invention will be set forth in the description which follows, and in part will be apparent from the description, or may be learned by practice of the invention.

An exemplary embodiment of the present invention provides a mother substrate for an organic light-emitting display apparatus, the mother substrate including: a panel area and a peripheral area surrounding the panel area; pixels disposed in a display area of the panel area; pads disposed in a non-display area of the panel area and coupled to the pixels; test wirings disposed in the peripheral area; a local buffer electrically connected to the test wirings; a bridge wiring connecting the local buffer to one of the pads; and a dummy resistance layer having one end in contact with the bridge wiring and another end in contact with one of the test wirings.

An exemplary embodiment of the present invention provides a mother substrate for an organic light-emitting display apparatus, the mother substrate including: a panel area and a peripheral area surrounding the panel area; pixels disposed in a display area of the panel area; a first pad and a second pad disposed in a non-display area of the panel area and coupled to the pixels; test wirings disposed in the peripheral area; a local buffer electrically connected to the test wirings; a first bridge wiring connecting the local buffer to the first pad; a dummy resistance layer having one end being in contact with the bridge wiring and another end being in contact with one of the test wirings; and a second bridge wiring directly connecting another one of the test wirings to the second pad.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the principles of the invention.

DETAILED DESCRIPTION OF THE ILLUSTRATED EMBODIMENTS

The invention is described more fully hereinafter with reference to the accompanying drawings, in which exemplary embodiments of the invention are shown. This invention may, however, be embodied in many different forms and should not be construed as limited to the exemplary embodiments set forth herein. Rather, these exemplary embodiments are provided so that this disclosure is thorough, and will fully convey the scope of the invention to those skilled in the art. In the drawings, the size and relative sizes of elements may be exaggerated for clarity. Like reference numerals in the drawings denote like elements.

It will be understood that although the terms "first", "second", etc. may be used herein to describe various components, these components should not be limited by these terms. These components are only used to distinguish one component from another. As used herein, the singular forms "a," "an" and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components. It will be understood that when a layer, region, or component is referred to as being "formed on," another layer, region, or component, it can be directly or indirectly formed on the other layer, region, or component. That is, for example, intervening layers, regions, or components may be present.

It will be understood that when an element or layer is referred to as being "on"; "connected to"; or "coupled to" another element or layer, it can be directly on; directly connected to; or directly coupled to the other element or layer, or intervening elements or layers may be present. In contrast, when an element or layer is referred to as being "directly on"; "directly connected to"; or "directly coupled to" another element or layer, there are no intervening elements or layers present. It will be understood that for the purposes of this disclosure, "at least one of X, Y, and Z" can be construed as X only, Y only, Z only, or any combination of two or more items X, Y, and Z (e.g., XYZ, XYY, YZ, ZZ).

In the following examples, the x-axis and the y-axis are not limited to two axes of the rectangular coordinate system, and may be interpreted in a broader sense. For example, the x-axis and the y-axis may be perpendicular to each another, or may lie in different directions that are not perpendicular to each another.

As used herein, the term "and/or" includes any and all combinations of one or more of the associated listed items.

Figure 1:
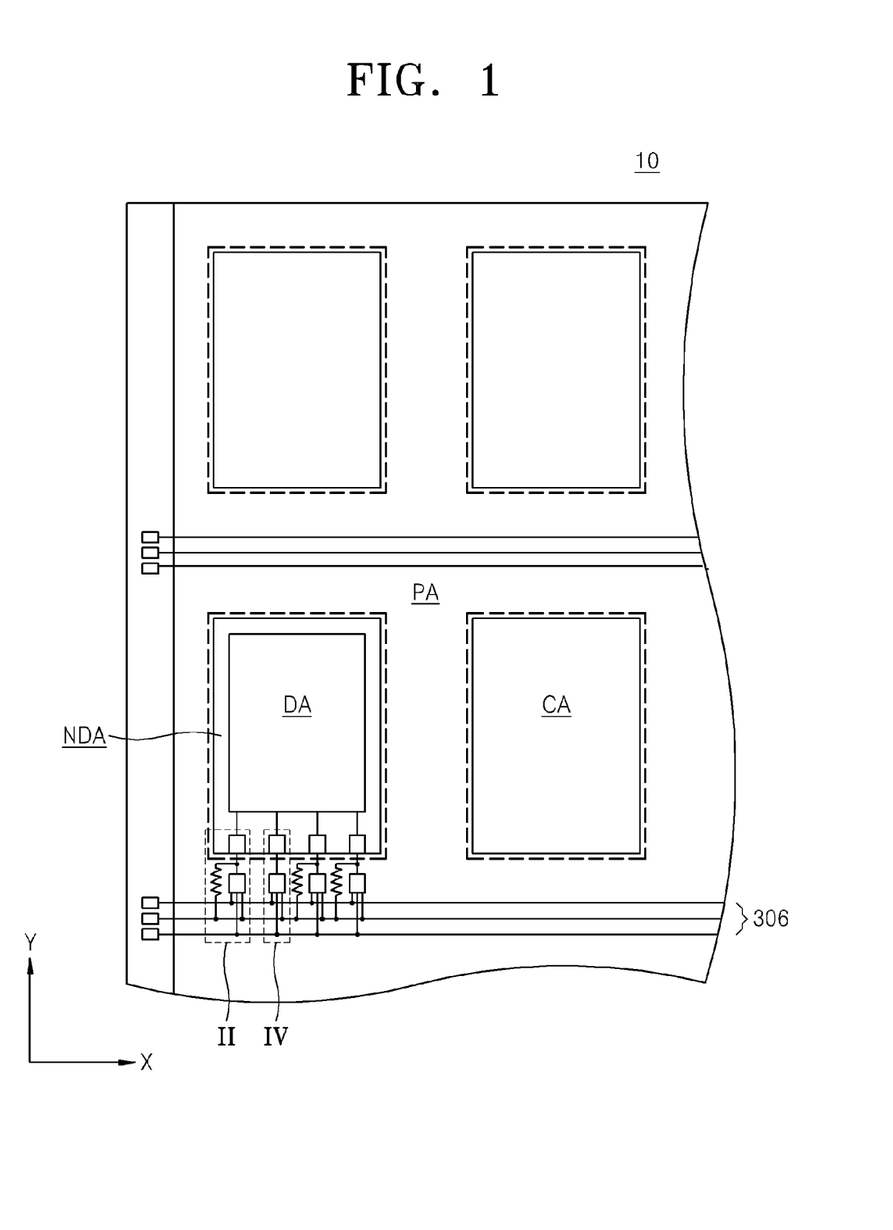
FIG. 1 is a plan view schematically illustrating a mother substrate for an organic light-emitting display apparatus, according to an exemplary embodiment of the present invention.

FIG. 1 is a plan view schematically illustrating a mother substrate 10 for an organic light-emitting display apparatus, according to an exemplary embodiment of the present invention. The mother substrate 10 includes a panel area CA, in which an organic light-emitting display panel is disposed, and a peripheral area PA that is a "dead area" around the panel area CA. A plurality of matrix-type panel areas CA may be included in the mother substrate 10 for an organic light-emitting display apparatus.

The panel area CA includes a display area DA, in which an image is displayed, and a non-display area NDA, in which an image is not displayed. Pixels are disposed in the display area DA. The pixels include a plurality of thin film transistors (TFTs) and an organic light-emitting device electrically connected to the plurality of TFTs. A driver for controlling the pixels disposed in the display area DA, pads for applying electrical signals transmitted from the outside to the pixels disposed in the display area DA, and wirings for electrically connecting the pads and the pixels may be disposed in the non-display area NDA.

Test wirings 306 are disposed in the peripheral area PA outside the panel area CA of the mother substrate 10 for an organic light-emitting display apparatus, and the test wirings 306 and the pads are electrically connected through a structure.

Figure 2:
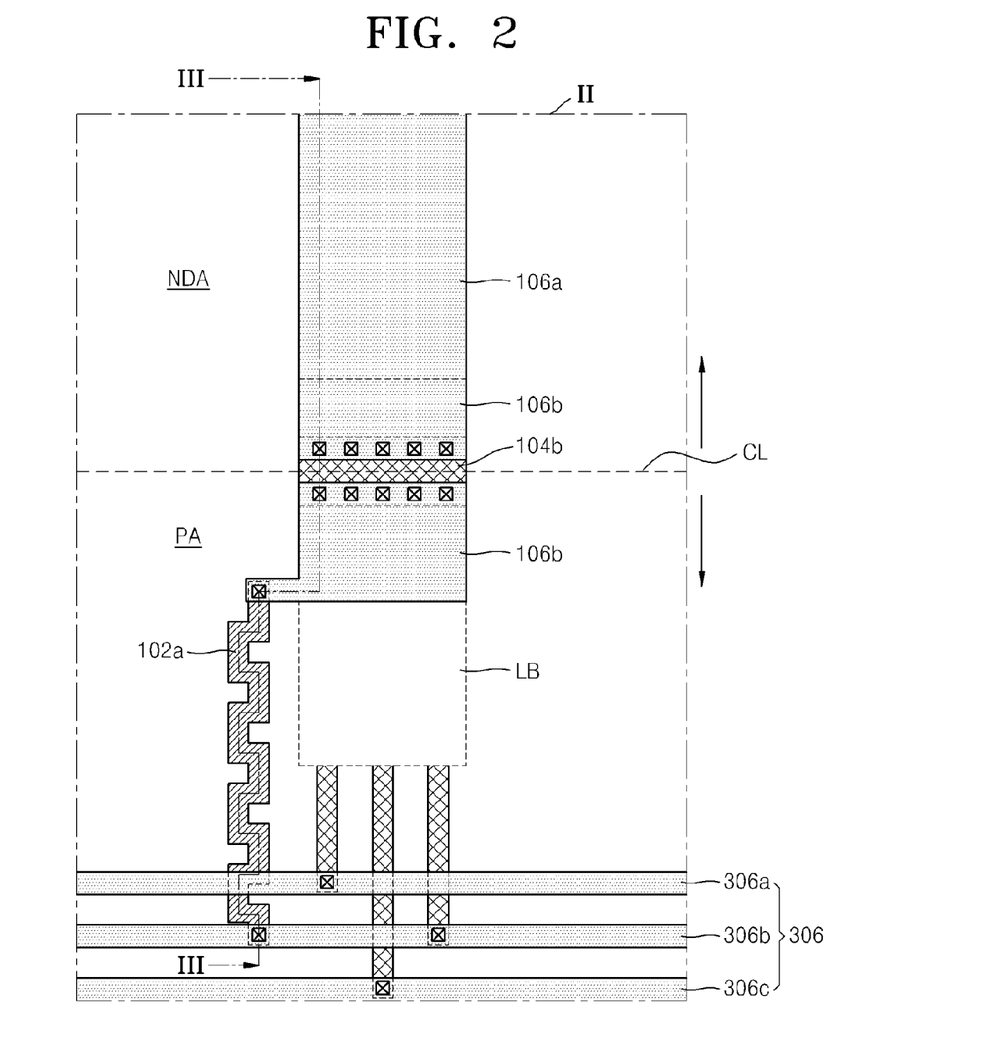
FIG. 2 is an enlarged plan view of region "II" of FIG. 1.
Figure 3:
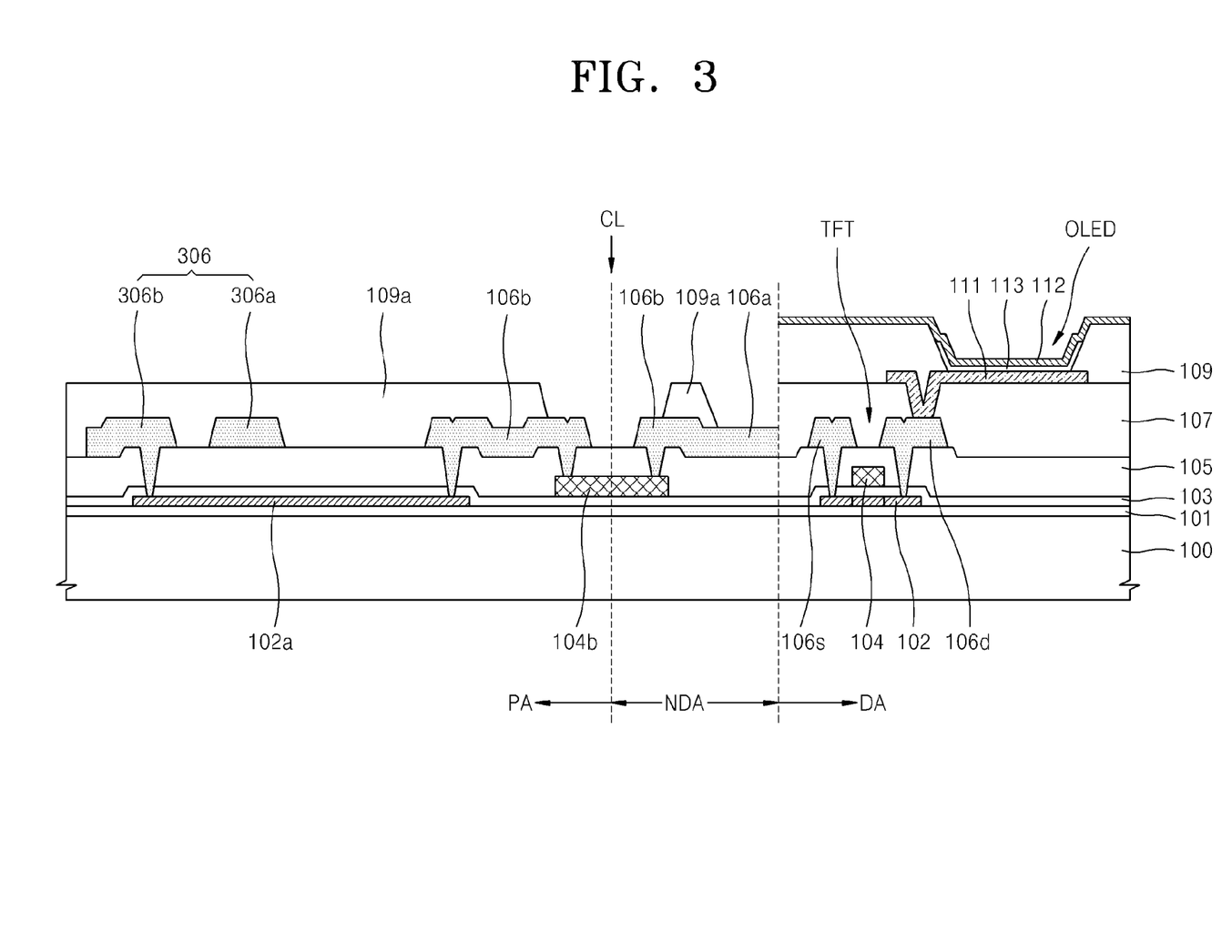
FIG. 3 is a cross-sectional view schematically illustrating a cross-section taken along line III-III of FIG. 2.

FIG. 2 is an enlarged plan view of region "II" of FIG. 1. Referring to FIG. 2, for example, a first pad 106a is electrically coupled to the test wirings 306 through a local buffer LB, a first bridge wiring 106b, and a dummy resistance layer 102a. FIG. 3, to be described later, is a cross-sectional view schematically illustrating a cross-section taken along line III-III of FIG. 2.

Figure 4:
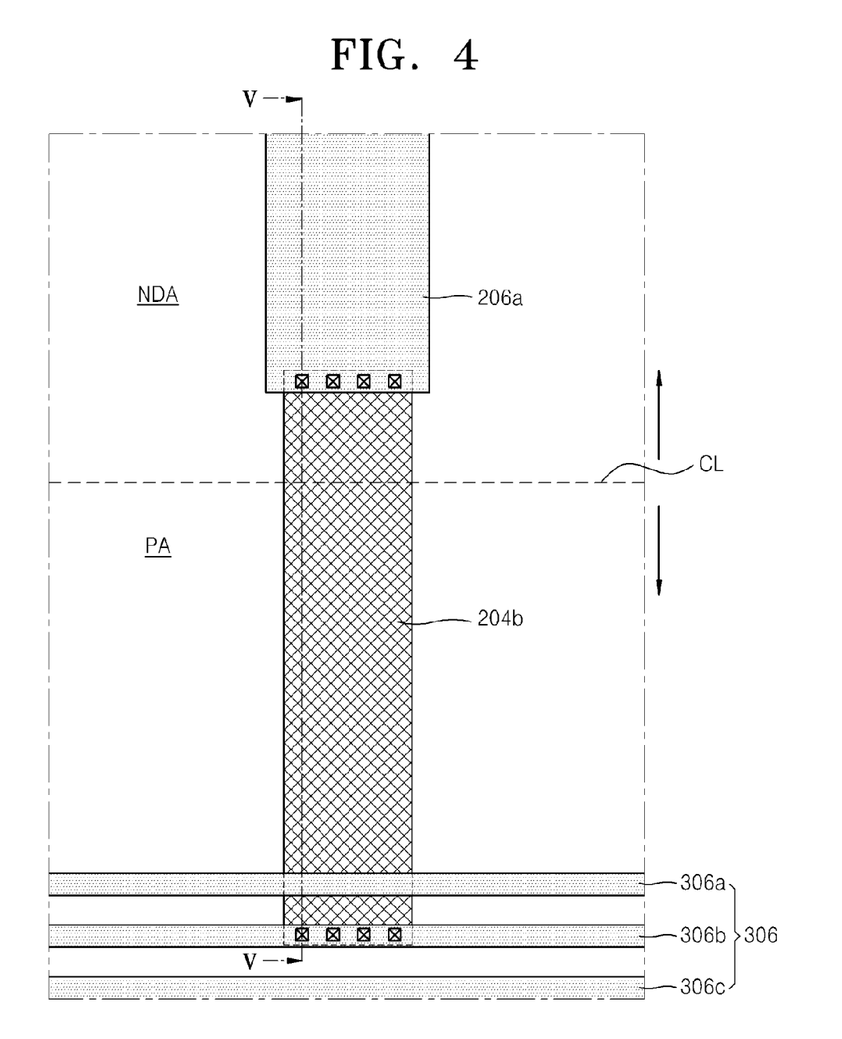
FIG. 4 is an enlarged plan view of region "IV" of FIG. 1.
Figure 5:
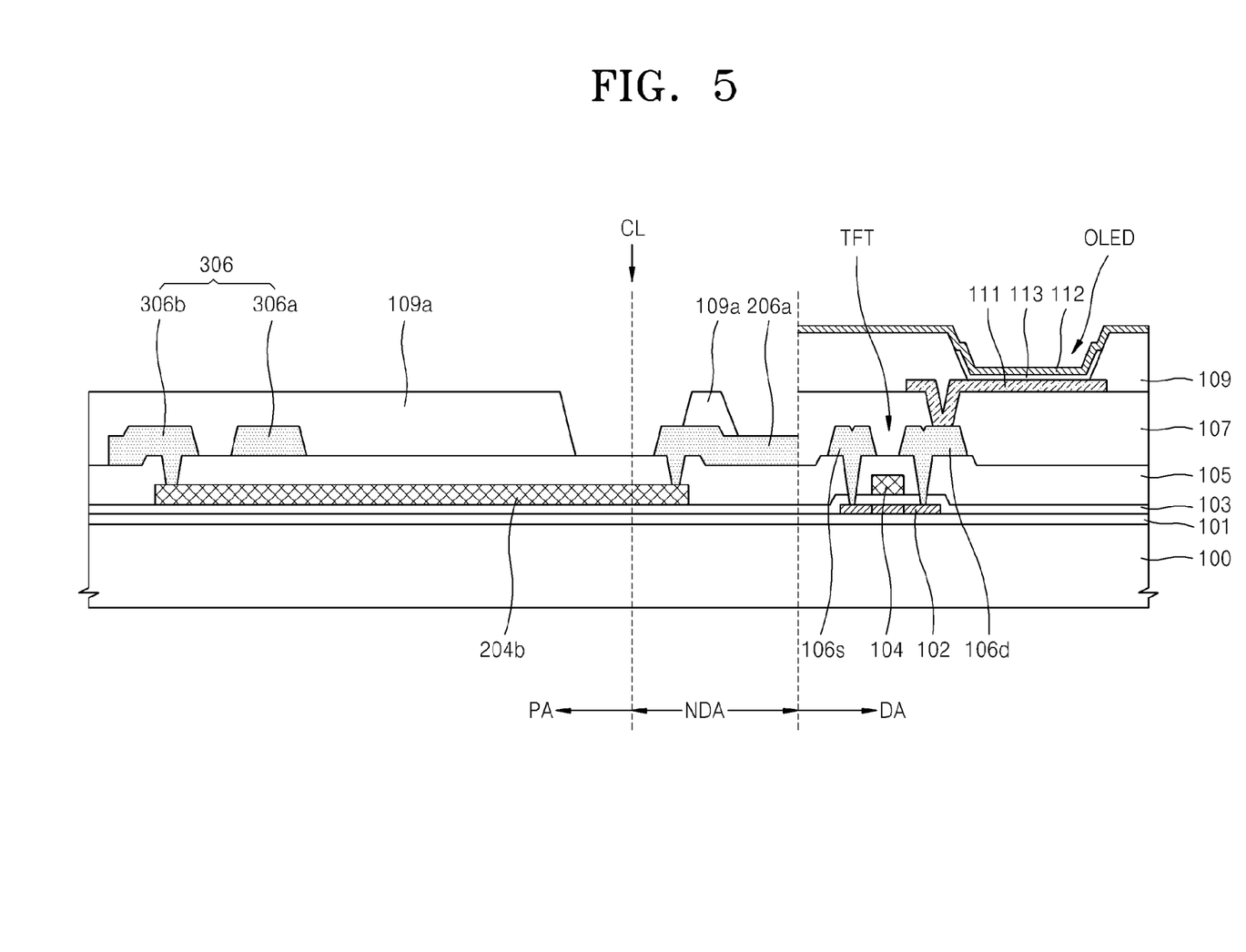
FIG. 5 is a cross-sectional view schematically illustrating a cross-section taken along line V-V of FIG. 4.

FIG. 4 is an enlarged plan view of region "IV" of FIG. 1. Referring to FIG. 4, for example, a second pad 206a is electrically connected to the test wirings 306 through a second bridge wiring 204b. FIG. 5 is a cross-sectional view schematically illustrating a cross-section taken along line V-V of FIG. 4, and will be described in more detail with reference to FIG. 3 below.

The mother substrate 10 for an organic light-emitting display apparatus disclosed in the present specification is different from a base substrate 100, and denotes a substrate in which an organic light-emitting display panel is formed in the panel area CA on the base substrate 100, and test wirings or the like are formed in the peripheral area PA.

Referring to FIGS. 3 and 5, the base substrate 100 may be formed of various materials, such as a glass material, a metallic material, or a plastic material. A buffer layer 101 formed of silicon oxide or silicon nitride is disposed on the base substrate 100 in order to planarize a surface of the base substrate 100 and/or prevent the penetration of impurities into a semiconductor layer 102.

The TFT disposed in the display area DA includes the semiconductor layer 102, a gate electrode 104, and source/drain electrodes 106s and 106d. The semiconductor layer 102 may include amorphous silicon, polysilicon, or an organic semiconductor material. A dummy resistance layer 102a is disposed in the peripheral area PA, and the dummy resistance layer 102a is formed of the same material and disposed on the same layer as the semiconductor layer 102 of the TFT disposed in the display area DA.

The gate electrode 104 is disposed adjacent to a channel region of the semiconductor layer 102, where the source/drain electrodes 106s and 106d are in electrical communication with each other according to a signal applied to the gate electrode 104. The gate electrode 104, for example, may be formed as a single layer or multiple layers of one or more materials of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu), in consideration of adhesion to adjacent layers, surface flatness of a stacked layer, and processability. A gate dielectric layer 103 formed of silicon oxide and/or silicon nitride may be disposed between the semiconductor layer 102 and the gate electrode 104, in order to insulate the semiconductor layer 102 and the gate electrode 104. An interlayer dielectric 105 may be disposed on the gate electrode 104, and the interlayer dielectric 105 may be formed as a single layer or multiple layers of a material, such as silicon oxide or silicon nitride. The gate dielectric layer 103 and the interlayer dielectric 105 may be formed on the entire base substrate 100 and, for example, may also be disposed on the peripheral area PA in addition to the panel area CA.

The source/drain electrodes 106s and 106d are disposed on the interlayer dielectric 105. The source/drain electrodes 106s and 106d are respectively electrically connected to the semiconductor layer 102 through contact holes formed in the interlayer dielectric 105 and the gate dielectric layer 103. The source/drain electrodes 106s and 106d, for example, may be formed as a single layer or multiple layers of one or more materials of Al, Pt, Pd, Ag, Mg, Au, Ni, Nd, Ir, Cr, Li, Ca, Mo, Ti, W, and Cu in consideration of conductivity. For example, in order to protect an easily oxidized aluminum layer (see 126b of FIG. 6), the source/drain electrodes 106s and 106d may have a multilayer structure in which titanium layers (see 116b and 136b of FIG. 6) having high corrosion resistance are stacked on and under the aluminum layer (see 126b of FIG. 6). Pads are disposed in the non-display area NDA of the panel area CA. The pads may have the same stack structure, may be formed of the same material, and may be disposed on the same layer as the source/drain electrodes 106s and 106d of the TFT. Also, the test wirings 306 are disposed in the peripheral area PA. The test wirings 306 may also have the same stack structure, may be formed of the same material, and may be disposed on the same layer as the source/drain electrodes 106s and 106d of the TFT.

A passivation layer 107 covering the TFT may be disposed in order to protect the TFT and to planarize a top surface thereof on which an OLED is to be formed. The passivation layer 107, for example, may be formed of an inorganic material, such as silicon oxide, silicon nitride, or silicon oxynitride, and may be formed of acrylic organic materials or benzocyclobutene (BCB). Although the passivation layer 107 is illustrated as a single layer in FIGS. 3, 5 and 6, it may also have a multilayer structure.

An OLED having a pixel electrode 111, a counter electrode 112, and an intermediate layer 113 disposed therebetween is disposed on the passivation layer 107 in the display area DA. The intermediate layer 113 includes a light-emitting layer.

An opening exposing one of the source/drain electrodes 106s and 106d of the TFT is included in the passivation layer 107. The pixel electrode 111, which is electrically connected to the TFT by being in contact with one of the source/drain electrodes 106s and 106d through the opening, is disposed on the passivation layer 107. The pixel electrode 111 may be formed as a (semi) transparent electrode or a reflective electrode. In a case where the pixel electrode 111 is formed as the (semi) transparent electrode, the pixel electrode 111, for example, may be formed of indium tin oxide (ITO), indium zinc oxide (IZO), ZnO, $In_2O_3$, indium gallium oxide (IGO), or aluminum zinc oxide (AZO). In a case where the pixel electrode 111 is formed as the reflective electrode, the pixel electrode 111 may have a reflective layer formed of Ag, Mg, Al, Pt, Pd, Au, Ni, Nd, Ir, Cr, or a compound thereof, and a layer formed of ITO, IZO, ZnO, $In_2O_3$, IGO, or AZO. However, the present invention is not limited thereto. The pixel electrode 111 may be formed of various other materials, and various modifications may also be possible. For example, the structure thereof may be a single layer or a multilayer structure.

A pixel-defining layer 109 may be disposed on the passivation layer 107. The pixel-defining layer 109 defines a pixel by having an opening corresponding to each pixel, i.e., an opening at least exposing a center portion of the pixel electrode 111. Also, the pixel-defining layer 109 operates to prevent the occurrence of arcs at ends of the pixel electrode 111 by increasing the distance between the ends of the pixel electrode 111 and the counter electrode 112 on the pixel electrode 111. As illustrated in FIG. 3, the pixel-defining layer 109 may also be disposed as a protective layer 109a in one or both of the non-display area NDA and the peripheral area PA, in addition to the display area DA. However, the pixel-defining layer 109 need not be disposed in either the non-display area NDA or the peripheral area PA. The pixel-defining layer 109, for example, may be formed of an organic material, such as polyimide.

The intermediate layer 113 of the OLED may include a low molecular weight material or a polymer material. In a case where the intermediate layer 113 includes a low molecular weight material, the intermediate layer 113 may be formed by stacking a hole injection layer (HIL), a hole transport layer (HTL), an emission layer (EML), an electron transport layer (ETL), and an electron injection layer (EIL) in a single or composite structure. Various materials, including copper phthalocyanine ($CuP_C$), N,N'-di(naphthalene-1-yl)-N,N'-diphenyl-benzidine (NPB), and tris-8-hydroxyquinoline aluminum (Alq3), may be used as a usable organic material. These layers may be formed by vacuum deposition.

In a case where the intermediate layer 113 includes a polymer material, the intermediate layer 113 may generally have a structure including the HTL and the EML. In this case, poly(ethylenedioxythiophene) (PEDOT) may be used as the HTL, and a polymer material, such as a poly(phenylenevinylene) (PPV) and a polyfluorene, may be used as the EML. The HTL and the EML may be formed by screen printing, inkjet printing, or laser induced thermal imaging (LITI).

However, the intermediate layer 113 is not limited thereto, and the intermediate layer 113 may have various other structures.

The counter electrode 112 is disposed on the display area DA, and the counter electrode 112 may cover the entire display area DA, as illustrated in FIG. 3. The counter electrode 112 may correspond to the pixel electrodes 111 by being formed in one piece in the OLEDs. The counter electrode 112 may be formed as a (semi) transparent electrode or a reflective electrode. In a case where the counter electrode 112 is formed as the (semi) transparent electrode, the counter electrode 112 may have a layer formed of a low work function metal, such as Li, Ca, LiF/Ca, LiF/Al, Al, Ag, Mg, or a compound thereof, and a (semi) transparent conductive layer, such as an ITO, IZO, ZnO, or $In_2O_3$ layer. In a case where counter electrode 112 is formed as the reflective electrode, the counter electrode 112 may have a layer formed of Li, Ca, LiF/Ca, LiF/Al, Al, Ag, Mg, or a compound thereof. However, the configuration and material of the counter electrode 112 are not limited thereto, and various modifications may be possible.

The test wirings 306 are disposed between the panel area and extend in one direction. For example, the test wirings 306 are disposed near the panel area CA, in which the pads are disposed, and may be disposed on the interlayer dielectric 105 in the same manner as the source/drain electrodes 106s and 106d of the TFT. The test wirings 306 are connected to the pads in a dummy region disposed at edges of the mother substrate 10, and is configured to receive electrical signals from the outside through the pads in the dummy region. Each of the test wirings 306 transmits a different electrical signal. For example, the test wirings 306 may include a first test wiring 306a, a second test wiring 306b, and a third test wiring 306a. The first test wiring 306a transmits a first electrical signal, the second test wiring 306b transmits a second electrical signal, and the third test wiring 306c transmits a third electrical signal. The second electrical signal may be direct current power. However, the number of the test wirings or the types of the signals transmitted by the test wirings is not limited to descriptions in the present specification.

Because the test wirings 306 have a width greater than those of other wirings in order to prevent a voltage drop as a result of a high line resistance, an area of the mother substrate 10 occupied by the test wirings 306 is wider than an area of the mother substrate 10 occupied by the other wirings. The test wirings 306 may transmit a greater number of carriers (electrons or holes) in comparison to the other wirings as a result of the wider area.

Hereinafter, the present invention will be described with reference to FIGS. 2 and 4 in addition to FIGS. 3 and 5. The pads respectively receive different electrical signals, wherein the first pad 106a may be regarded as a pad that mainly receives a clock signal composed of high and low signals. The second pad 206a may be regarded as a pad that receives direct current power having a preset value or an electrical signal which is not a clock signal.

Although high and low values of the clock signal applied to the first pad 106a should be distinguished, there is a greater risk that distortion of the clock signal may occur as a result of the IR drop of the test wirings 306. Therefore, as illustrated in FIG. 2, the test wirings 306 and the first pad 106a may be coupled by the local buffer LB.

The local buffer LB amplifies electrical signals and includes a plurality of thin film transistors and a plurality of capacitors. Because the first pad 106a is connected to the test wirings 306 through the local buffer LB, the first pad 106a is substantially isolated from the test wirings 306. Although described later in FIG. 6, if the dummy resistance layer 102a does not exist, galvanic corrosion may occur in the aluminum layer (see 126b of FIG. 6) of the first pad 106a as a result of an etchant used during the patterning of the pixel electrode 111 of the TFT.

One end of the dummy resistance layer 102a is in direct contact with the first bridge wiring 106b that is directly connected to the first pad 106a, and the other end thereof is in direct contact with one of the test wirings 306. Because the first bridge wiring 106b and the test wirings 306 are all included in the same layer as the source/drain electrodes of the TFT, contact holes are included in the gate dielectric layer 103 and the interlayer dielectric 105 in order for the dummy resistance layer 102a to be physically in contact with the first bridge wiring 106b and one of the test wirings 306. The dummy resistance layer 102a connects the first pad 106a, which is substantially isolated by the local buffer LB, to one of the test wirings 306 through the first bridge wiring 106b. Because the first pad 106a is not substantially isolated from the test wirings 306 as a result of the dummy resistance layer 102a, the galvanic corrosion due to the etchant used during the patterning of the pixel electrode 111 of the TFT may be prevented.

As described above, the dummy resistance layer 102a is formed of the same material and disposed on the same layer as the semiconductor layer 102 of the TFT. The dummy resistance layer 102a, for example, may be formed of polysilicon. The dummy resistance layer 102a may have a non-linear shape in plan view. Because the dummy resistance layer 102a is formed of a semiconductor material and has the non-linear shape, the dummy resistance layer 102a may exhibit a higher resistance, in comparison to a case where the dummy resistance layer 102a is formed of a conductive material and has a linear shape. Because the dummy resistance layer 102a may exhibit a relatively high resistance, the local buffer LB may operate properly and interference to the electrical signal applied to the first pad 106a through the local buffer LB may be significantly reduced or prevented.

The test wiring, which is in contact with the dummy resistance layer 102a, may be the second test wiring 306b that transmits direct current power. The second test wiring 306b in contact with the dummy resistance layer 102a may be directly connected to the local buffer LB. For example, the local buffer LB may be directly connected to the test wirings 306. Since FIG. 2 is an exemplary illustration, the type and number of the test wirings 306 connected to the local buffer LB are not limited.

The first bridge wiring 106b, which is in contact with the dummy resistance layer 102a, may be formed of the same material and may be disposed in the same layer as the first pad 106a. For example, at least a part of the first bridge wiring 106b may be formed in one piece with the first pad 106a. Similar to the first pad 106a, the first bridge wiring 106b may also include the corrosive aluminum layer (see 126b of FIG. 6), and the presence of the dummy resistance layer 102a inhibits corrosion of the first bridge wiring 106b as well as the first pad 106a dummy resistance layer.

All parts of the first bridge wiring 106b may be formed in one piece with the first pad 106a. However, as illustrated in FIG. 3, the first bridge wiring 106b may include two or more different conductive layers. According to the exemplary embodiment illustrated in FIGS. 2 and 3, a part of the first bridge wiring 106b formed in one piece with the first pad 106a may have a discontinuous portion. The discontinuous portion may be electrically connected to the part of the first bridge wiring 106b formed in one piece with the first pad 106a through a connection part 104b formed in a different layer from that of the first pad 106a and the first bridge wiring 106b. The connection part 104b may be disposed on the same layer as the gate electrode 104 of the TFT. The discontinuous portion, i.e., the connection part 104b, overlaps a cutting line CL for separating the panel area CA from the peripheral area PA. Because the connection part 104b overlapping the cutting line CL of the first bridge wiring 106b crossing the cutting line CL is formed on the layer of the gate electrode 104, which is a layer lower than the layer on which the source/drain electrodes 106s and 106d are formed, wear of a blade may be prevented during cutting of the organic light-emitting display panel, thereby facilitating the cutting.

Referring to FIGS. 4 and 5, because the second pad 206a, unlike the first pad 106a, receives an electrical signal which is not a clock signal, or direct current power from the test wiring, the second pad 206a and the test wiring are directly connected through the second bridge wiring 204b, and not via the local buffer LB. One end of the second bridge wiring 204b may be in contact with the second pad 206a, and the other end of the second bridge wiring 204b may be in contact with one of the test wirings 306. FIGS. 4 and 5 show that the second test wiring 306b is in contact with the second bridge wiring 204b. However, the second bridge wiring 204b may be in contact with another test wiring.

The second bridge wiring 204b, similar to the first bridge wiring 106b, may be formed in one piece with the second pad 206a. However, as illustrated in FIG. 4, the second bridge wiring 204b may be included in a layer that is different from the second pad 206a. According to the exemplary embodiment illustrated in FIGS. 4 and 5, the second bridge wiring 204b may be disposed in the same layer as the gate electrode 104 of the TFT. A part of the second bridge wiring 204b overlaps the cutting line CL for separating the panel area CA from the peripheral area PA. Because the second bridge wiring 204b is formed in the same layer as the gate electrode 104 of the TFT, the wear of the blade may be prevented during the cutting of the organic light-emitting display panel, thereby facilitating the cutting.

Figure 6:
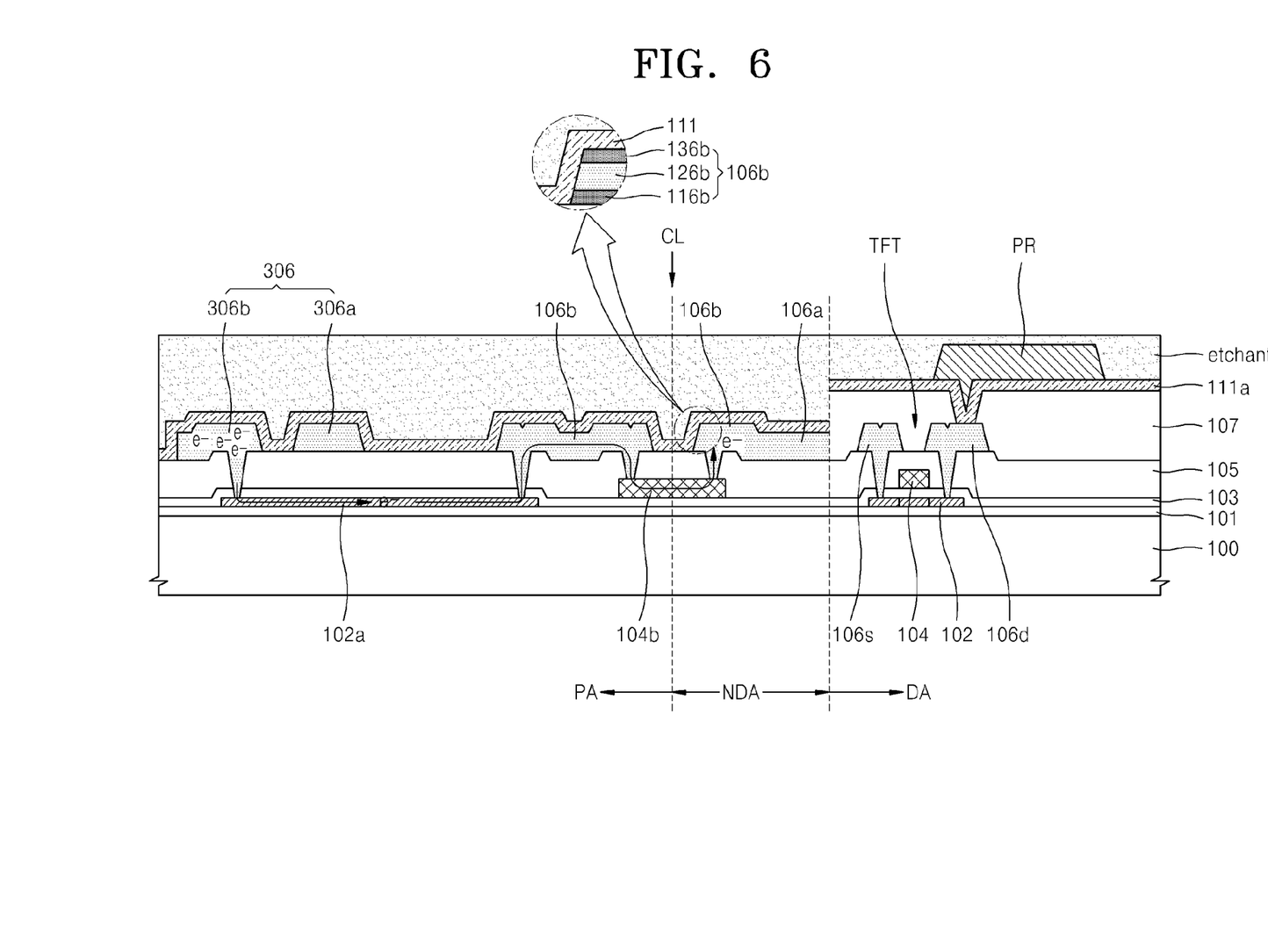
FIG. 6 is a cross-sectional view schematically illustrating a state during a manufacturing process of the mother substrate for an organic light-emitting display apparatus of FIG. 3.

FIG. 6 is a cross-sectional view schematically illustrating a state during a manufacturing process of the mother substrate 10 of FIG. 3.

A passivation layer 107 is formed in the display area DA, and an electrode material layer 111a for the pixel electrode 111 is entirely formed on a top surface of the mother substrate 10 in order to form the pixel electrode 111 of the OLED. In order to pattern the electrode material layer 111a into the pixel electrode 111, a photoresist pattern PR is formed where the pixel electrode 111 is to be formed. The electrode material layer 111a may be wet etched by using the photoresist pattern PR as a mask. The remaining electrode material layer 111a, excluding the electrode material layer 111a that is covered with the photoresist pattern PR, is exposed to an etchant for wet etching. The first pad 106a and the first bridge wiring 106b are formed in a stack structure having an aluminium layer 126b that is disposed between upper and lower titanium layers 116b and 136b. The end of the aluminium layer 126b is not covered with the titanium layers 116b and 136b at the ends of the first bridge wiring 106b or the edges of the first pad 106a. Because the aluminium layer 126b may lose electrons, galvanic corrosion resulting from an oxidation reaction may be facilitated during a wet etching process of the electrode material layer 111a.

However, because the dummy resistance layer 102a electrically connects the test wiring to the first bridge wiring 106b and the first pad 106a, the first bridge wiring 106b and the first pad 106a may receive carriers (electrons) from the test wiring. Because the received electrons may be provided in the oxidation reaction during the wet etching process, and depletion of the electrons in the aluminium layer 126b may be relatively reduced, corrosion of the first pad 106a and the first bridge wiring 106b may be prevented.

As described above, according to the one or more of the above exemplary embodiments of the present invention, a mother substrate for an organic light-emitting display apparatus having a structure that may prevent the corrosion of the pad during the patterning process of the pixel electrode may be realized. It should be understood that the exemplary embodiments described therein should be considered in a descriptive sense only and not for purposes of limitation. Descriptions of features or aspects within each embodiment should typically be considered as available for other similar features or aspects in other embodiments.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A mother substrate for an organic light-emitting display apparatus, the mother substrate comprising:
    a panel area comprising a display area and a non-display area;
    a peripheral area surrounding the panel area;
    pixels disposed in the display area;
    pads disposed in the non-display area and coupled to the pixels;
    test wirings disposed in the peripheral area;
    a local buffer electrically connected to the test wirings;
    a bridge wiring connecting the local buffer to one of the pads; and
    a dummy resistance layer having a first end that contacts the bridge wiring and a second end that contacts one of the test wirings.

2. The mother substrate of claim 1, wherein the dummy resistance layer comprises a semiconductor material.

3. The mother substrate of claim 1, further comprising thin film transistors disposed in the pixels, wherein the dummy resistance layer is disposed in a same layer as a semiconductor layers of the thin film transistors.

4. The mother substrate of claim 1, wherein the dummy resistance layer has a non-linear shape.

5. The mother substrate of claim 1, wherein the one of the test wirings is in contact with the dummy resistance layer and is configured to transmit direct current power.

6. The mother substrate of claim 1, wherein the pads comprise an aluminum layer.

7. The mother substrate of claim 1, wherein the bridge wiring comprises an aluminum layer.

8. The mother substrate of claim 1, wherein the one of the pads that is connected to the bridge wiring and at least one part of the bridge wiring are integrally formed in one piece.

9. The mother substrate of claim 8, wherein:
    the at least one part of the bridge wiring comprises a discontinuous portion; and
    the discontinuous portion is electrically connected to the at least one part of the bridge wiring that is integrally formed in one piece with the one of the pads through a connection part that is formed in a different layer from each other.

10. The mother substrate of claim 9, wherein the at least one part of the bridge wiring that is integrally formed in one piece with the one of the pads is disposed in a same layer as a layer of source/drain electrodes of a thin film transistor that is included in the pixels, and the connection part is disposed in a same layer as gate electrodes of the thin film transistor.

11. The mother substrate of claim 10, wherein the discontinuous portion overlaps a cutting line separating the panel area from the peripheral area.

12. A mother substrate for an organic light-emitting display apparatus, the mother substrate comprising:
    a panel area comprising a display area and a non-display area;
    a peripheral area surrounding the panel area;
    pixels disposed in the display area;
    a first pad and a second pad disposed in a non-display area of the panel area and are coupled to the pixels;
    test wirings disposed in the peripheral area;
    a local buffer electrically connected to the test wirings;
    a first bridge wiring connecting the local buffer to the first pad;
    a dummy resistance layer having a first end that contacts with the bridge wiring and a second end that contacts one of the test wirings; and
    a second bridge wiring that directly connects another one of the test wirings to the second pad.

13. The mother substrate of claim 12, wherein the dummy resistance layer comprises a semiconductor material.

14. The mother substrate of claim 12, further comprising thin film transistors disposed in the pixels, wherein the dummy resistance layer is disposed in a same layer as a semiconductor layers of the thin film transistors.

15. The mother substrate of claim 12, wherein the dummy resistance layer has a non-linear shape.

16. The mother substrate of claim 12, wherein the one of the test wirings is in contact with the dummy resistance layer and is configured to transmit direct current power.

17. The mother substrate of claim 12, wherein the first pad and the second pad each comprise an aluminum layer.

18. The mother substrate for an organic light-emitting display apparatus of claim 1, wherein the first bridge wiring comprises an aluminum layer.

19. The mother substrate for an organic light-emitting display apparatus of claim 1, wherein the first pad and at least one part of the first bridge wiring are integrally formed in one piece.

20. A substrate for an organic light-emitting display apparatus, the substrate comprising:
    a panel area;
    a peripheral area surrounding the panel area;
    pixels disposed in a display area of the panel area;
    pads disposed in a non-display area of the panel area and coupled to the pixels;
    test wirings disposed in the peripheral area;
    a buffer electrically connected to the test wirings;
    a wiring connecting the local buffer to one of the pads; and
    a dummy resistance layer having one end in contact with the bridge wiring and another end in contact with one of the test wirings,
    wherein the dummy resistance layer comprises a semiconductor material and has a non-linear shape.

* * * * *